(12) United States Patent
Ito et al.

(10) Patent No.: US 11,226,509 B2
(45) Date of Patent: Jan. 18, 2022

(54) DISPLAY APPARATUS

(71) Applicant: Japan Display Inc., Minato-ku (JP)

(72) Inventors: Hirotaka Ito, Tokyo (JP); Kaoru Inoue, Tokyo (JP); Hiromichi Tanaka, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/938,202

(22) Filed: Jul. 24, 2020

(65) Prior Publication Data

US 2021/0033911 A1 Feb. 4, 2021

(30) Foreign Application Priority Data

Aug. 1, 2019 (JP) .............................. JP2019-142267

(51) Int. Cl.
*H05K 1/00* (2006.01)
*G02F 1/1333* (2006.01)
*H05K 1/18* (2006.01)

(52) U.S. Cl.
CPC ....... *G02F 1/133305* (2013.01); *H05K 1/189* (2013.01); *H05K 2201/10136* (2013.01); *H05K 2201/10681* (2013.01)

(58) Field of Classification Search
CPC .............. G02F 1/133305; H05K 1/189; H05K 2201/10136; H05K 2201/10681

USPC ........................................................ 361/749
See application file for complete search history.

(56) References Cited

U.S. PATENT DOCUMENTS

| 8,144,473 | B2 * | 3/2012 | Yumoto | G02F 1/13452 |
| | | | | 361/749 |
| 8,153,903 | B2 * | 4/2012 | Kanouda | H05K 5/02 |
| | | | | 174/255 |
| 2011/0216270 | A1 * | 9/2011 | Koyama | G02F 1/133308 |
| | | | | 349/65 |
| 2019/0219863 | A1 | 7/2019 | Tezen et al. | |

FOREIGN PATENT DOCUMENTS

| JP | 2005-122078 A | 5/2005 |
| JP | 2009-272457 A | 11/2009 |
| JP | 2019-124829 A | 7/2019 |

* cited by examiner

*Primary Examiner* — Andargie M Aychillhum
(74) *Attorney, Agent, or Firm* — Oblon, McClelland, Maier & Neustadt, L.L.P.

(57) ABSTRACT

Performance of a display apparatus is improved. The display apparatus includes: a substrate having a side surface (first side surface); a backlight unit (light supply portion) having a side surface (second side surface); a flexible wiring board having a wiring electrically connected to a terminal (first terminal) and having an insulating film with flexibility covering the wiring; and a double-sided tape. The flexible wiring board is bonded to the side surface of the backlight unit through the double-sided tape.

7 Claims, 7 Drawing Sheets

DISPLAY APPARATUS

CROSS-REFERENCE TO RELATED APPLICATION

The present application claims priority from Japanese Patent Application No. 2019-142267 filed on Aug. 1, 2019, the content of which is hereby incorporated by reference into this application.

TECHNICAL FIELD OF THE INVENTION

The present invention relates to a technique of a display apparatus.

BACKGROUND OF THE INVENTION

Each of a Patent Document 1 (Japanese Patent Application Laid-Open Publication No. 2009-272457), a Patent Document 2 (Japanese Patent Application Laid-Open Publication No. 2005-122078) and a Patent Document 3 (Japanese Patent Application Laid-Open Publication No. 2019-124829) describes a display apparatus that is obtained by bonding a substrate of the display apparatus and a wiring board connected to this substrate by using a paste-form resin, and then, curing this resin.

SUMMARY OF THE INVENTION

As a part of performance improvement of each display apparatus, the inventors of the present application have studied a technique of reducing a frame region of each display apparatus. To a substrate included in the display apparatus, a flexible wiring board is connected. The flexible wiring board is curved so as to be bent from a front surface side of the substrate to a back surface side of the substrate, and is housed in an enclosure. In view of reduction of an area of a peripheral region around an effective display region of the display apparatus, it is preferable to reduce a gap between the curved part of the flexible wiring board and the substrate or a light supply portion on the back surface side of the substrate.

A purpose for the present invention is to provide a technique of improving the performance of the display apparatus.

A display apparatus according to one embodiment of the present invention includes: a first substrate having a first front surface having a first terminal formed thereon, a first back surface positioned on an opposite side of the first front surface and a first side surface crossing the first front surface and the first back surface; a light supply portion having a second front surface facing the first back surface, a second back surface positioned on an opposite side of the second front surface and a second side surface crossing the second front surface and the second back surface; a flexible wiring board having a wiring electrically connected to the first terminal and having an insulating film with flexibility covering the wiring; and a double-sided tape having a base film and a pasting layer formed on each of both surfaces of the base film. The flexible wiring board is bonded to the second side surface of the light supply portion through the double-sided tape.

BRIEF DESCRIPTIONS OF THE DRAWINGS

DESCRIPTIONS OF THE PREFERRED EMBODIMENTS

Figure 1:
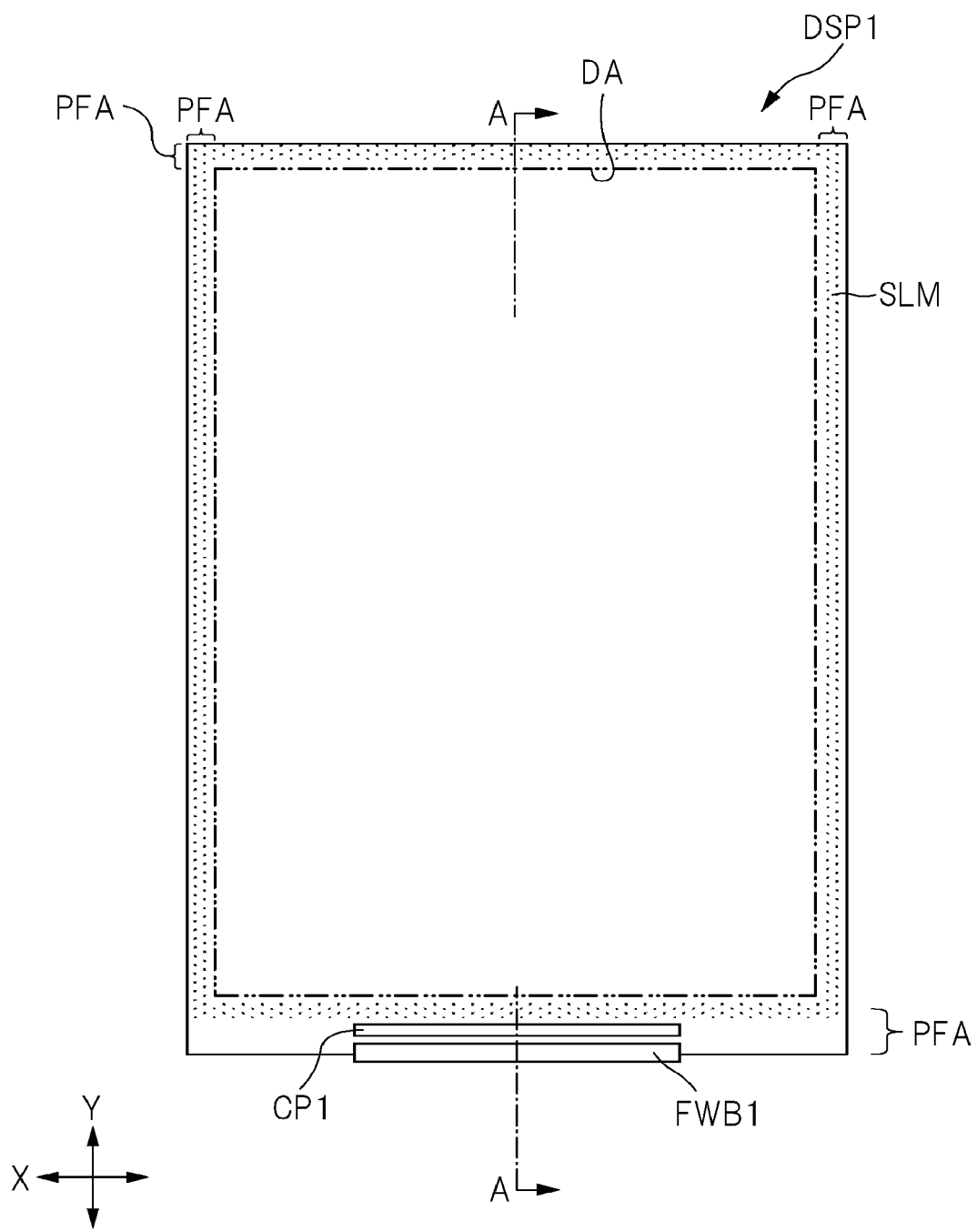
FIG. 1 is a planar view on a display surface side showing one example of a display apparatus according to one embodiment.

The following is explanation for each embodiment of the present invention with reference to drawings. Note that disclosure shows only one example, and appropriate modification with keeping the concept of the present invention which can be easily anticipated by those who are skilled in the art is obviously within in the scope of the present invention. Also, in order to make the clear description, a width, a thickness, a shape, and others of each portion in the drawings are schematically illustrated more than those in an actual aspect in some cases. However, the illustration is only one example, and does not limit the interpretation of the present invention. In the present specification and each drawing, similar elements to those described earlier for the already-described drawings are denoted with the same or relative reference characters, and detailed description for them is appropriately omitted in some cases.

A liquid crystal display apparatus is roughly classified into the following two types depending on a direction of application of an electric field for use in changing alignment of liquid crystal molecules of a liquid crystal layer. In other words, as the first classification, so-called vertical electric field mode in which the electric field is applied in a thickness direction (or an out-of-plane direction) of the display apparatus is cited. As the vertical electric field mode, for example, a TN (Twisted Nematic) mode, a VA (Vertical Alignment) mode and others are cited. As the second classification, so-called horizontal electric field mode in which the electric field is applied in a planar direction (or an in-plane direction) of the display apparatus is cited. As the horizontal electric field mode, for example, an IPS (In-Plane Switching) mode, a FFS (Fringe Field Switching) mode that is one of the IPS modes and others are cited. A technique described below is applicable to both the vertical electric field mode and the horizontal electric field mode.

First Embodiment

<Display Apparatus>

Figure 2:
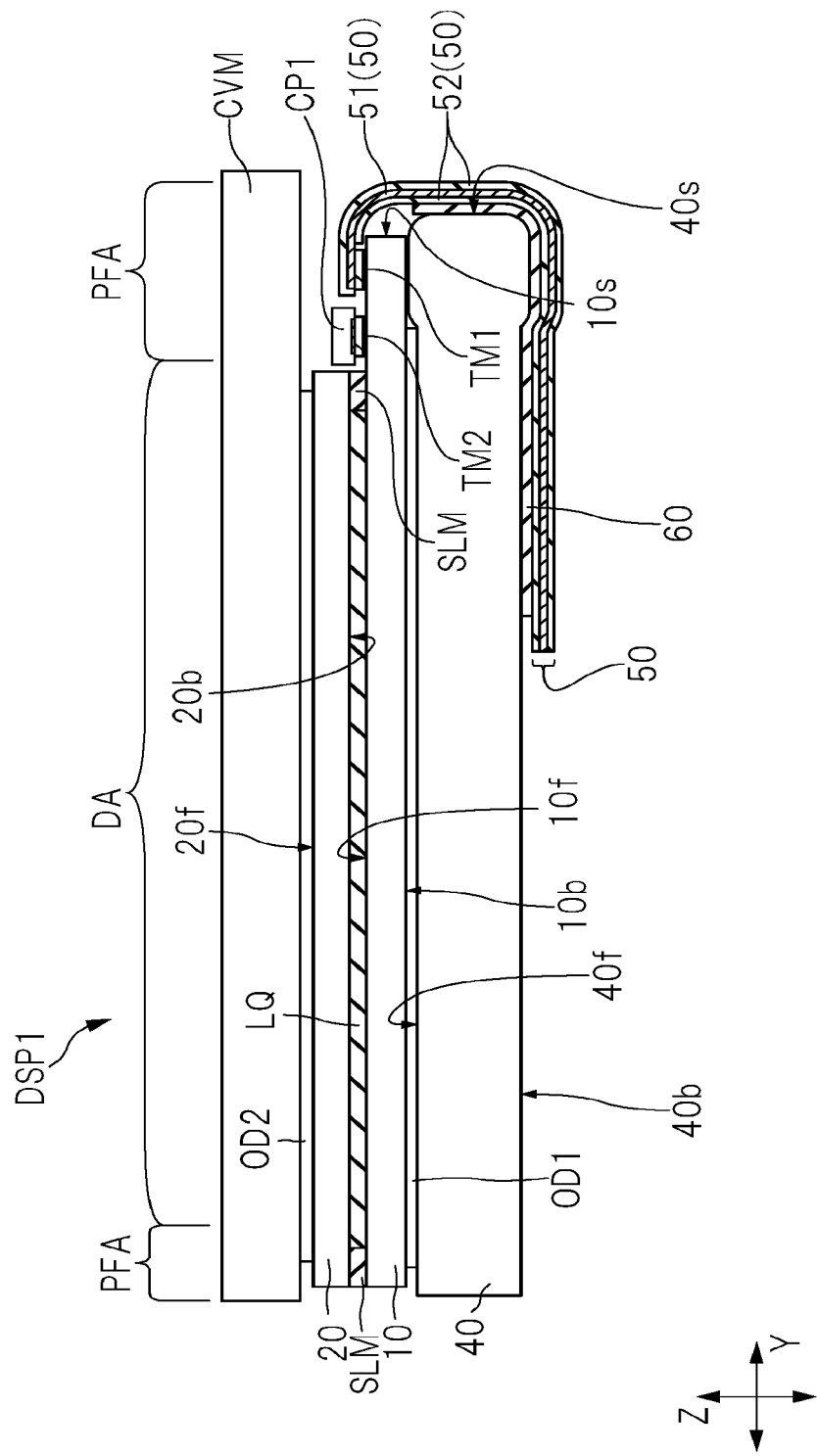
FIG. 2 is a cross-sectional view taken along a line A-A of FIG. 1.
Figure 3:
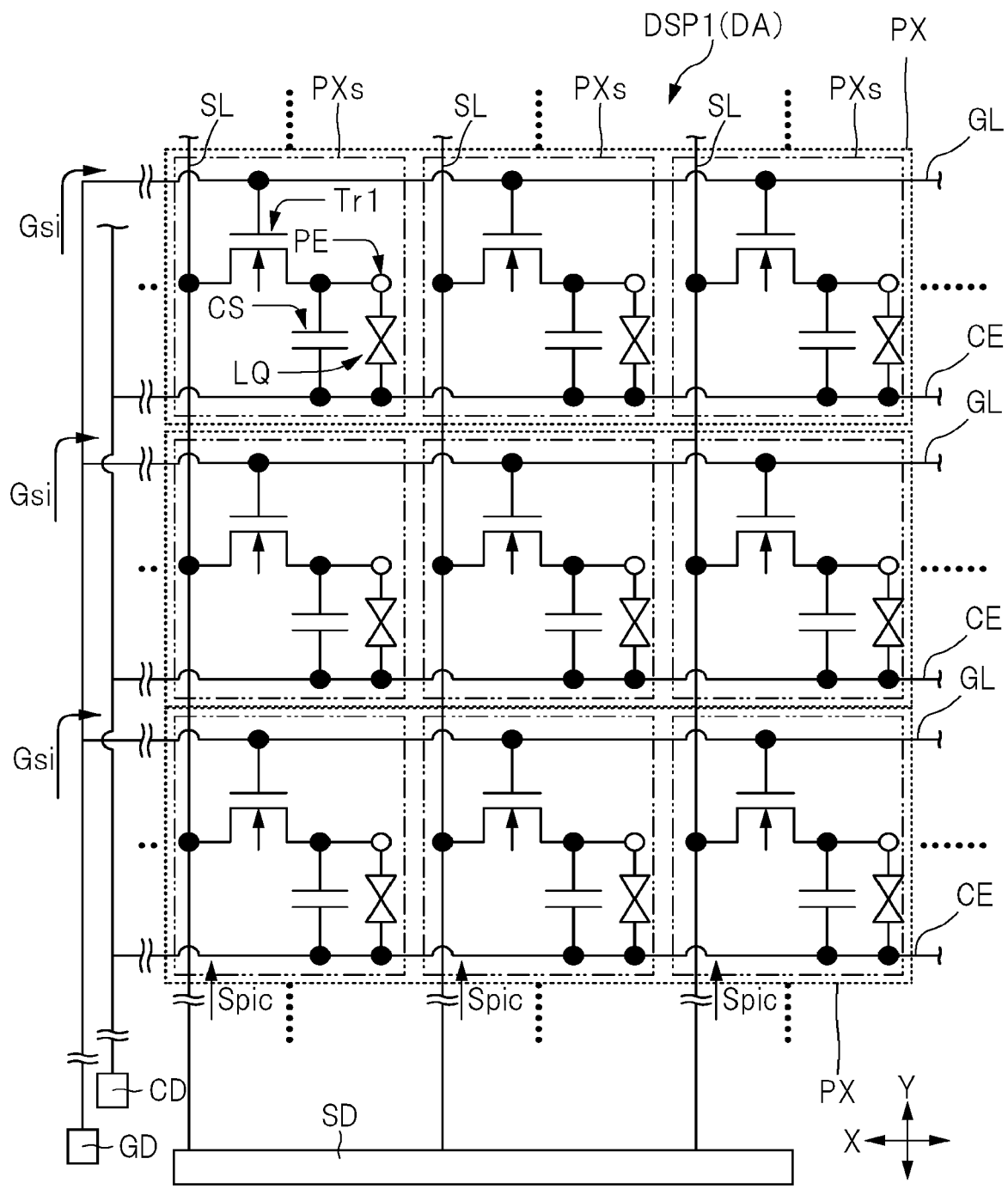
FIG. 3 is a circuit diagram showing a circuit configuration example around a pixel included in the display apparatus shown in FIG. 1.
Figure 4:
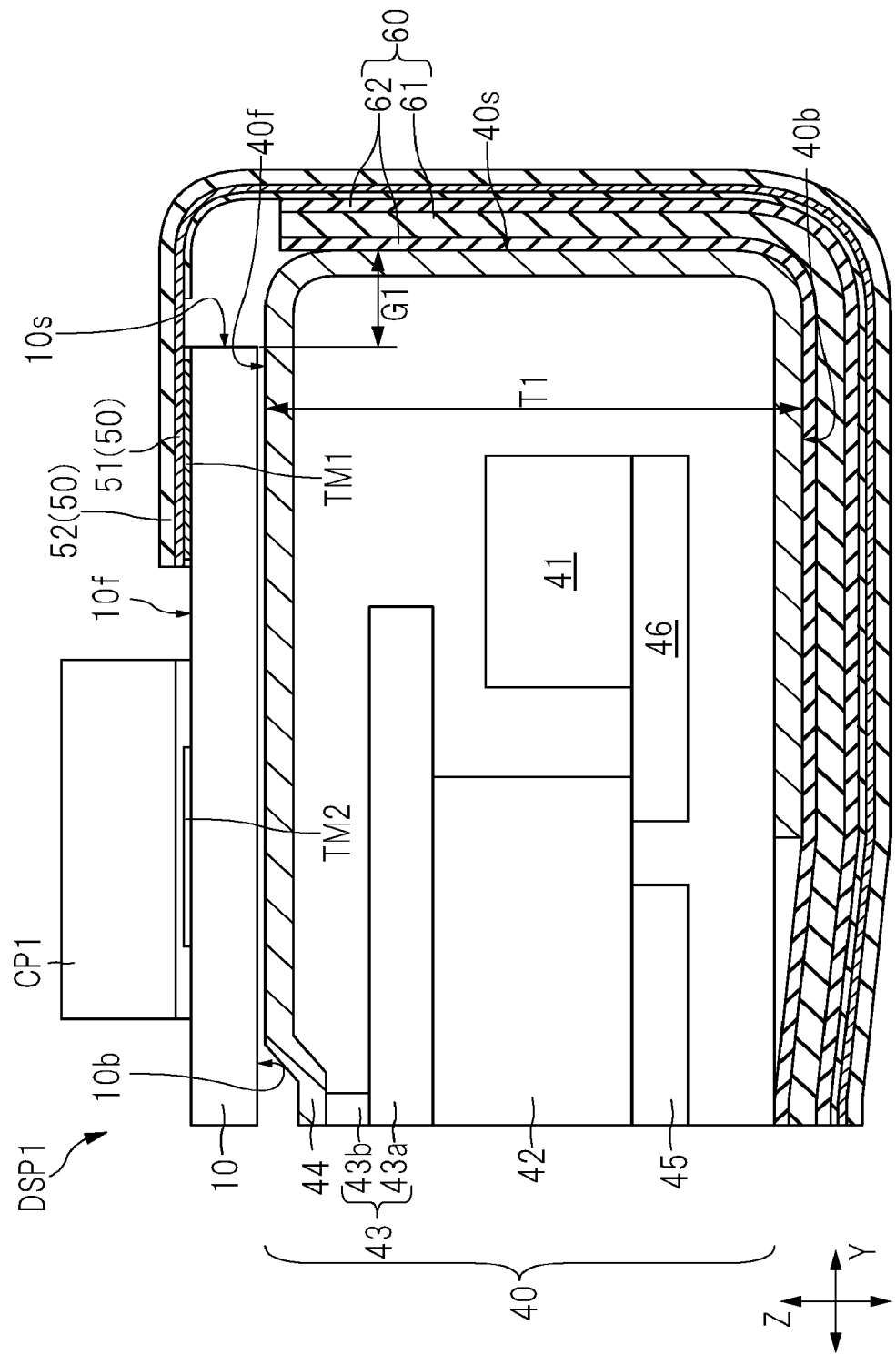
FIG. 4 is an enlarged cross-sectional view around a bonding portion between a backlight unit and a flexible wiring board 50 shown in FIG. 2.
Figure 5:
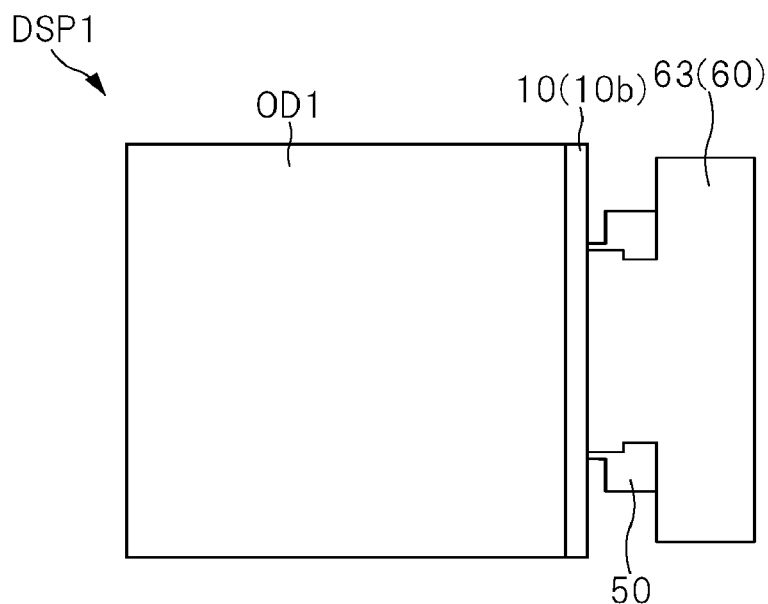
FIG. 5 is a planar view showing an assembly step of bonding the flexible wiring board to the backlight unit.

First, a configuration example of the display apparatus will be explained. FIG. 1 is a planar view on a display surface side showing one example of the display apparatus according to the present embodiment. In FIG. 1, a boundary between a display region DA and a peripheral region PFA is shown with a dashed double-dotted line. In FIG. 1, a region where a sealing member SLM is arranged is shown with a dot pattern. FIG. 2 is a cross-sectional view taken along a line A-A of FIG. 1. As shown in FIG. 4 described later, in addition to the liquid crystal layer LQ, a plurality of conductive layers and insulating layers exist between a substrate 10 and a substrate 20. However, these elements are omitted in FIG. 2. FIG. 3 is a circuit diagram showing a circuit configuration example around a pixel included in the display apparatus shown in FIG. 1. FIG. 4 is an enlarged cross-sectional view of the display region of the display apparatus shown in FIG. 2. In FIG. 4, in order to exemplify a positional relation between a scan signal line GL and an image signal line SL in a thickness direction of the substrate 10 (a Z direction shown in FIG. 4), a scan signal line GL formed on a different cross section from that of FIG. 4 is shown with a dotted line. FIG. 5 is an enlarged cross-sectional view showing a configuration example of a transistor shown in FIG. 3.

As shown in FIG. 1, a display apparatus DSP1 of the present embodiment includes the display region DA. In the display region DA, images are formed in accordance with an input signal supplied from outside. The display region DA is an effective region where the display apparatus DSP1 displays the images in a plan view in which the display surface is viewed. The display apparatus DSP1 includes a peripheral region (non-display region) PFA around the display region DA in a plan view. While the display apparatus DSP1 includes the peripheral region PFA around the display region DA, a display apparatus including the display region DA even on an edge portion is also cited as a modification example. The technique described below is also applicable to the display apparatus of the type including the display region DA even on the edge portion. Although the display region DA of the display apparatus DSP1 shown in FIG. 1 has a rectangular shape, the display region may have a shape such as a polygonal shape, a circular shape and others other than the rectangular shape.

As shown in FIG. 2, the display apparatus DSP1 includes the substrate 10 and the substrate 20 that are pasted so as to face each other through the liquid crystal layer LQ. The substrate 10 and the substrate 20 face each other in the thickness direction (Z direction) of the display apparatus DSP1. The substrate 10 has a front surface (main surface, surface) 10f facing the liquid crystal layer LQ (and the substrate 20) and a back surface (main surface, surface) 10b positioned on an opposite side of the front surface 10f. The substrate 10 has a side surface 10s crossing the front surface 10f and the back surface 10b. The substrate 20 has a back surface (main surface, surface) 20b facing the front surface 10f of the substrate 10 (and the liquid crystal layer LQ). The substrate 10 is an array substrate in which a plurality of transistors (transistor elements) Tr1 (see FIG. 3) serving as switching elements (active elements) are arranged in an array form. The substrate 20 is a substrate formed on the display surface side. The substrate 20 can be also reworded as an opposite substrate meaning a substrate that is opposite to the array substrate.

The liquid crystal layer LQ is between the front surface 10f of the substrate 10 and the back surface 20b of the substrate 20. The liquid crystal layer LQ is an electrooptic layer for use in controlling a visible light penetrating state. The liquid crystal layer LQ has a function of modulating the light penetrating itself by controlling a state of an electric field formed around the liquid crystal layer LQ through the switching element (the transistor Tr1 shown in FIG. 3). The display regions DA of the substrate 10 and the substrate 20 overlap the liquid crystal layer LQ as shown in FIG. 2.

The substrate 10 and the substrate 20 are bonded to each other through the sealing member (bonding member) SLM. As shown in FIG. 1, the sealing member SLM is arranged in the peripheral region PFA so as to surround the periphery of the display region DA. As shown in FIG. 2, the liquid crystal layer LQ is inside the sealing member SLM. The sealing member SLM plays a role as a sealing material that seals the liquid crystal between the substrate 10 and the substrate 20. Also, the sealing member SLM plays a role as a bonding material that bonds the substrate 10 and the substrate 20.

The display apparatus DSP1 includes an optical element OD1 and an optical element OD2. The optical element OD1 is arranged between the substrate 10 and the backlight unit 40. The optical element OD2 is arranged on the display surface side of the substrate 20, in other words, an opposite side of the substrate 10 across the substrate 20. Each of the optical element OD1 and the optical element OD2 includes at least a polarizer, and may include a phase shift plate (waveplate) if needed. The backlight unit 40 has a front surface 40f facing the back surface 10b of the substrate 10 and a back surface 40b positioned on an opposite side of the front surface 40f. Also, the backlight unit 40 includes a side surface 40s crossing the front surface 40f and the back surface 40b.

The display apparatus DSP1 includes a cover member CVM (see FIG. 2) covering the display surface side of the substrate 20. The cover member CVM faces the front surface 20f that is on the opposite side of the back surface 20b of the substrate 20. In other words, the cover member CVM faces the front surface 10f that is on the opposite side of the back surface 10b of the substrate 10. The substrate 20 is between the cover member CVM and the substrate 10 in the Z direction. The cover member CVM is a protection member that protects the substrates 10 and 20 and the optical element OD2, and is arranged on the display surface side of the display apparatus DSP1. However, a case without the cover member CVM may be also applicable as a modification example of the present embodiment.

Each of the substrate 10 and the substrate 20 is a transparent plate having visible-light transmissivity (that is a property allowing the visible light to be transmitted). As a substrate that is the transparent plate, a glass substrate can be exemplified. As a constituent material of the substrate 10 and the substrate 20, a resin material containing polymer such as polyimide, polyamide, polycarbonate, polyester or others (a resin material having the visible-light transmissivity) can be also used.

In a case of the present embodiment, the flexible wiring board 50 is connected to the peripheral region PFA of the substrate 10. A terminal TM1 is formed on the front surface 10f of the substrate 10. The terminal TM1 is formed between the side surface 10s and the display region DA. The flexible wiring board 50 includes a wiring 51 connected to the terminal TM1 and an insulating film 52 that covers the wiring 51 and that is formed so as to be bendable and deformable.

In the case of the present embodiment, a semiconductor chip CP1 is mounted in the peripheral region PFA of the substrate 10. A terminal TM2 is formed on the front surface 10f of the substrate 10. The terminal TM2 is formed between the terminal TM1 and the display region DA. The semiconductor chip CP1 is mounted on the terminal TM2. The terminal TM2 and the semiconductor chip CP1 are electrically connected to each other.

One end of the flexible wiring board 50 is connected onto the front surface 10f of the substrate 10, and the other end is arranged on the back surface 40b side of the backlight unit 40. The flexible wiring board 50 is bent so as to cover the side surface 10s of the substrate 10 and the side surface 40s of the backlight unit 40. The flexible wiring board 50 is bonded to the backlight unit 40 through a double-sided tape 60. Details of a structure that bonds the flexible wiring board 50 and the backlight unit 40 will be described later.

The light that is supplied from the backlight unit 40 reaches the cover member CVM through the optical element OD1 including the polarizer, the substrate 10, the liquid crystal layer LQ, the substrate 20 and the optical element OD2. An optical filter layer although not illustrated is arranged between the substrate 20 and the liquid crystal layer LQ. The optical filter layer includes a light blocking film that blocks the visible light and a plurality of types of color filter films.

As shown in FIG. 3, a plurality of pixels PX are arranged in the display region DA. In an example shown in FIG. 3, each of the plurality of pixels PX includes a plurality of subpixels PXs. The plurality of subpixels PXs include subpixels PXs for use in, for example, a red color, a blue color and a green color, and a color image can be displayed by control of color gradation of the plurality of subpixels PXs. As the number of types of the subpixels PXs configuring one pixel PX, not only the three types exemplified in FIG. 3 but also various modification examples are applicable.

Each of the plurality of subpixels Pxs is provided with the transistor Tr1 that is a switching element that controls turning ON/OFF of the electric field applied to the liquid crystal layer LQ. The transistor Tr1 controls an operation of the subpixel PXs. The transistor Tr1 is a thin film transistor (TFT) formed on the substrate 10 as described later.

As shown in FIG. 3, in the display region DA, the display apparatus DSP1 includes a plurality of scan signal lines GL extending in an X direction and a plurality of image signal lines SL extending in a Y direction crossing (in FIG. 3, being orthogonal to) the X direction. The scan signal line GL is a gate line connected to a gate of the transistor Tr1. The image signal line SL is a source line connected to a source of the transistor Tr1. The plurality of scan signal lines GL extend in the X direction and are arrayed in the Y direction at, for example, an equal distance therebetween. The plurality of image signal lines SL extend in the Y direction and are arrayed in the X direction at, for example, an equal distance therebetween.

Each of the plurality of scan signal lines GL is connected to a scan driving circuit (gate driving circuit) GD. A scan signal Gsi that is output from the scan driving circuit GD is input to the gate of the transistor Tr1 through the scan signal line GL. Each of the plurality of image signal lines SL is connected to an image signal driving circuit SD. An image signal Spi that is output from the image signal driving circuit SD is input to the source of the transistor Tr1 through the image signal line SL.

Each of the plurality of image signal line SL is connected to a pixel electrode PE trough the transistor Tr1. More specifically, the image signal line SL is connected to the source of the transistor Tr1, and the pixel electrode PE is connected to a drain of the transistor Tr1. When the transistor Tr1 is turned ON, an image signal Spic is supplied from the image signal line SL to the pixel electrode PE. The pixel electrode PE is connected to a common electrode CE through a dielectric layer (a capacitive element CS shown in FIG. 3). To the common electrode CE, a fixed potential is supplied from a common potential supply circuit CD. The fixed potential that is supplied to the common electrode CE is a common potential among the plurality of subpixels PXs. In a display period, the electric field is formed in each subpixel PXs in accordance with a potential difference between a potential supplied to the common electrode CE and a potential supplied to the pixel electrode PE, and the liquid crystal molecules contained in the liquid crystal layer LQ are driven by this electric field.

Each of the scan driving circuit GD, the image signal driving circuit SD and the common potential supply circuit CD shown in FIG. 3 is formed in, for example, a semiconductor chip CP1 mounted in the peripheral region PFA of the substrate 10 shown in FIG. 2. However, as a modification example, a case of mounting the semiconductor chip CP1 in the flexible wiring board 50 connected to the peripheral region PFA shown in FIG. 2 is cited. As another modification example, a case of formation of a part or all of the scan driving circuit GD, the image signal driving circuit SD and the common potential supply circuit CD serving as built-in circuits in the substrate 10 is cited.

<Bonding of Flexible Wiring Board>

FIG. 4 is an enlarged cross-sectional view around a bonding portion between the backlight unit and the flexible wiring board 50 shown in FIG. 2.

As shown in FIG. 2, the display apparatus DSP1 of the present embodiment is provided with the backlight unit 40 serving as a light supply portion that supplies light to the liquid crystal layer LQ. The backlight unit 40 includes, for example, a light source element 41, a light guiding panel 42 that supplies the light supplied from the light source element 41 toward the liquid crystal layer LQ, and an optical element 43 serving as a functional film having an optical function. As one example, the optical element 43 is made of a first optical sheet 43a (diffusion sheet) and a second optical sheet 42b (prism sheet), and the first optical sheet 43a is arranged between the light guiding panel 42 and the second optical sheet 43b. A reflective sheet 45 is arranged on a lower surface of the light guiding panel 42, and the light guiding panel 42 and the light source element 41 are fixed to each other by a fixing tape 46. The portion around the backlight unit 40 is covered with a light blocking member 44 for use in suppressing light leakage toward the side surface 40s of the backlight unit 40. The light blocking member 44 may be a light blocking tape pasted on a case of the backlight unit 40 or be the light-blocking case itself. The case may be reworded as other expressions such as an enclosure, a housing, a frame, and a bezel.

The double-sided tape 60 is provided with a base film 61 having flexibility and a plurality of sticking layers 62 arranged on both sides of the base film 61. One sticking layer 62 is boned to the backlight unit 40. The other sticking layer 62 is bonded to the flexible wiring board 50. The double-sided tape 60 is bonded to at least the side surface 40s of the backlight unit 40.

In order to reduce an area of the peripheral region PFA shown in FIG. 1, it is necessary to reduce a distance from an outer edge of the display apparatus DSP1 to the substrate 10 (see FIG. 2) and reduce a distance from the outer edge of the display apparatus DSP1 to the backlight unit 40. Therefore, for example, during an assembly step of housing the display apparatus DSP1 in the enclosure not illustrated, it is preferable to bond the flexible wiring board 50 to at least the side surface 40s of the backlight unit 40 in view of avoidance of the contact between the flexible wiring board 50 and the enclosure.

In the present embodiment, the flexible wiring board 50 is bonded to the backlight unit 40 through the double-sided tape 60. As a study example for the present embodiment, a method of using a paste-from resin bonding member as the bonding material for use in bonding the backlight unit 40 and the flexible wiring board 50 is cited. However, when the paste-form bonding member is used, it is difficult to control a thickness of the applied resin. Therefore, a gap distance between the backlight unit 40 and the flexible wiring board 50 easily varies.

On the other hand, as described in the present embodiment, when the backlight unit 40 and the flexible wiring board 50 are bonded to each other by the double-side tape 60, it is easy to control a thickness of the double-sided tape 60. In other words, a margin for the gap distance between the backlight unit 40 and the flexible wiring board 50 that are bonded can be reduced. As a result, the gap between the enclosure and the substrate 10 can be reduced, and therefore, the area of the peripheral region PFA shown in FIG. 1 can be reduced.

As shown in FIG. 4, in a thickness direction of the backlight unit 40 (a Z direction shown in FIG. 4), the side surface 10s of the substrate 10 and the side surface 40s of the backlight unit 40 do not overlap each other. A part of the front surface 40f of the backlight unit 40 (more specifically, a part including the side surface 40s) does not overlap the substrate 10. In other words, a part of the backlight unit 40 protrudes outward from an end of the substrate 10. A gap G1 between the side surface 10s and the side surface 40s is, for example, about 200 μm.

When a modification example of FIG. 4 has a structure in which the side surface 10s and the side surface 40s overlap each in the Z direction, the flexible wiring board 50 is sharply bent on the side surface 10S of the substrate 10. In this case, a bending stress is applied to a wiring 51 of the flexible wiring board 50. Particularly, since the side surface 10s of the substrate 10 is close to the terminal TM1 connected to the wiring 51, the wiring 51 of the flexible wiring board 50 is exposed at a position overlapping the side surface 10s from an insulating film 52 protecting the wiring 51. Therefore, the position at which the wiring 51 is exposed from the insulating film 52 has a possibility of damage on the wiring 51 depending on a degree of the bending stress applied to the wiring 51. On the other hand, when the part of the front surface 40f of the backlight unit 40, the part including the side surface 40s, has the structure not overlapping the substrate 10 as shown in FIG. 4, a bend radius of the curved portion at which the flexible wiring board 50 is bent can be increased. As a result, since the stress applied to the wiring 51 of the flexible wiring board 50 can be reduced in a portion near the connecting portion with the terminal TM1, the damage on the wiring 51 can be suppressed.

In view of improvement of bonding strength between the flexible wiring board 50 and the backlight unit 40, it is preferable to increase a bonding area between the double-sided tape 60 and the backlight unit 40. A thickness T1 of the backlight unit 40 shown in FIG. 4 (a distance between one of the front surface 40f and the back surface 40b to the other) is, for example, about 1 mm. Therefore, when the double-sided tape 60 is bonded to only the side surface 40S of the backlight unit 40, it is difficult to increase the bonding area between the double-sided tape 60 and the backlight unit 40. In the case of the bonding method using the double-sided tape 60, the bonding strength tends to be smaller than that of a bonding method of curing the paste-form bonding member. Therefore, it is particularly preferable to increase the bonding area between the double-sided tape 60 and the backlight unit 40. In the present embodiment, as shown in FIG. 4, the flexible wiring board 50 is bonded to the side surface 40s and the back surface 40b of the backlight unit 40 through the double-sided tape 60.

In the example shown in FIG. 4, a bonding area between the double-sided tape 60 and the back surface 40b is larger than a bonding area between the double-sided tape 60 and the side surface 40s. When the double-sided tape 60 is bonded also to the back surface 40b of the backlight unit 40 as described above, the bonding area can be increased. As a result, each of the bonding strength between the backlight unit 40 and the double-sided tape 60 and the bonding strength between the double-sided tape 60 and the flexible wiring board 50 can be enhanced, so that the double-sided tape 60 can be prevented from peeling off.

<Bonding Method of Flexible Wiring Board>

Next, as shown in FIG. 4, the method of bonding the flexible wiring board 50 to the backlight unit 40 will be explained. Each of FIGS. 5 to 9 is a planar view showing the assembly step of bonding the flexible wiring board to the backlight unit.

In the assembly steps of the display apparatus DSP1 shown in FIG. 4, the double-sided tape 60 is pasted first on the back surface of the flexible wiring board 50 as shown in FIG. 5. At this time, while one sticking layer 62 (see FIG. 4) of the double-sided tape 60 is pasted on the flexible wiring board 50, a separator sheet shown in FIG. 5 is pasted on the other sticking layer 62 (see FIG. 4). On the back surface 10b of the substrate 10, the optical element OD1 including the light polarizer is pasted.

Figure 6:
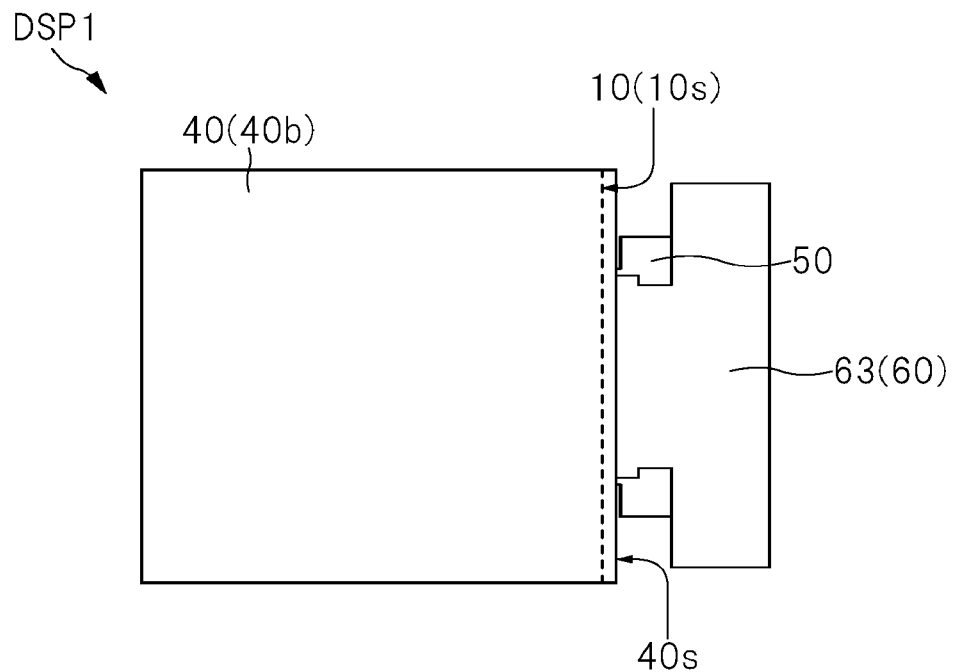
FIG. 6 is a planar view showing a step continued from FIG. 5 in the assembly step of bonding the flexible wiring board to the backlight unit.

Next, onto the optical element OD1 pasted on the back surface 10b of the substrate 10, the backlight unit 40 is pasted as shown in FIG. 6. As shown in FIG. 6, in a plan view obtained by viewing the apparatus from the back surface 10b of the substrate 10 (see FIG. 5), the side surface 10s of the substrate 10 is covered with the backlight unit 40.

Figure 7:
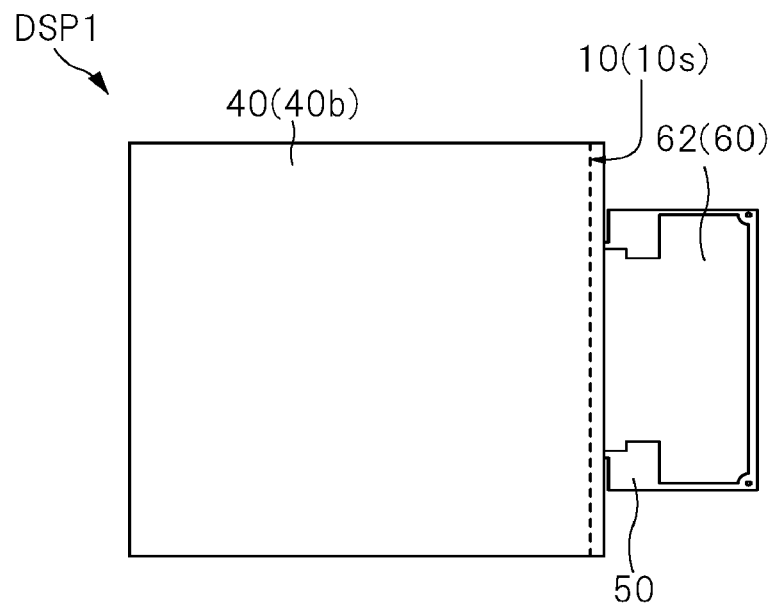
FIG. 7 is a planar view showing a step continued from FIG. 6 in the assembly step of bonding the flexible wiring board to the backlight unit.
Figure 8:
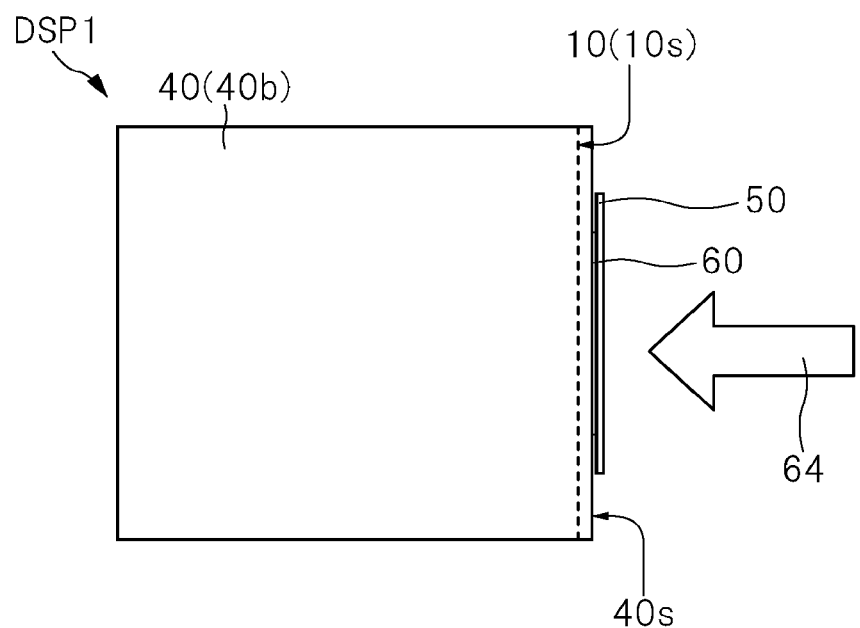
FIG. 8 is a planar view showing a step continued from FIG. 7 in the assembly step of bonding the flexible wiring board to the backlight unit.

Next, as shown in FIG. 7, the separator sheet 63 (see FIG. 6) that is pasted on one sticking layer 62 of the double-sided tape 60 is peeled off so that the sticking layer 62 is exposed. Next, as shown in FIG. 8, an eternal force 64 is applied while the flexible wiring board 50 pasted with the double-sided tape 60 is stretched upward (in a direction from the front surface 10f to the back surface 10b of the substrate 10 shown in FIG. 2), and the double-sided tape 60 is bonded to the side surface 40s of the backlight unit 40. Although methods of applying the external force 64 include various modification examples, it is preferable to, for example, use a jig capable of pressing entire part of the double-sided tape 60, the part facing the side surface 40s of the backlight unit 40.

Figure 9:
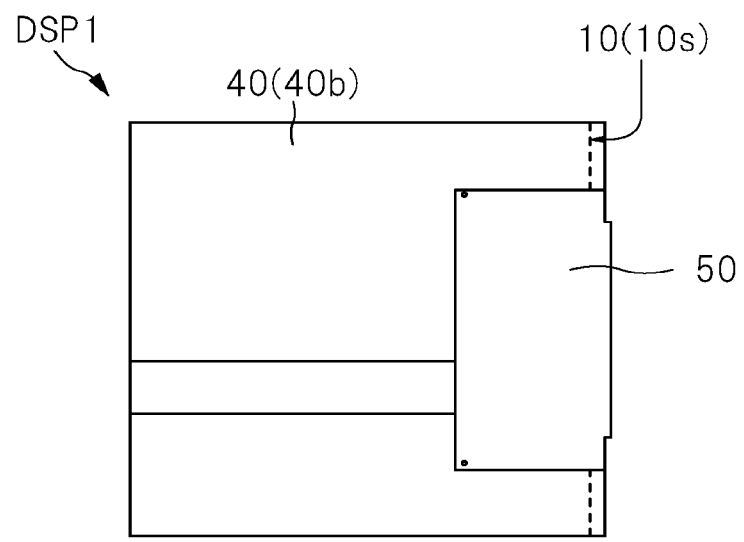
FIG. 9 is a planar view showing a step continued from FIG. 8 in the assembly step of bonding the flexible wiring board to the backlight unit.

Next, as shown in FIG. 9, the flexible wiring board 50 is boned to the back surface 40b of the backlight unit 40 through the double-sided tape 60. As shown in FIG. 4, this manner can provide the display apparatus DSP1 including the flexible wiring board 50 being bonded to the side surface 40s and the back surface 40b of the backlight unit 40 through the double-sided tape 60.

Figure 10:
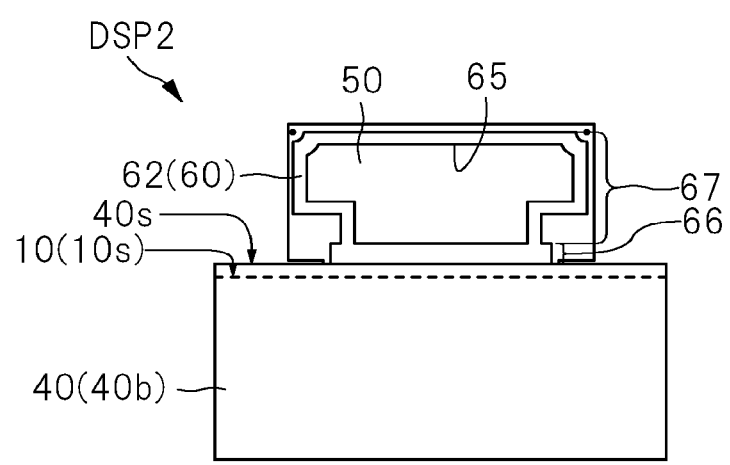
FIG. 10 is a planar view showing a modification example of FIG. 7.

Next, modification examples will be explained. FIG. 10 is a planar view showing a modification example of FIG. 7. A display apparatus DSP2 shown in FIG. 10 is different from the display apparatus DSP1 shown in FIG. 7 in that the double-sided tape 60 is provided with an opening 65.

The double-sided tape 60 included in the display apparatus DSP2 includes a region 66 facing the side surface 405 of the backlight unit 40 and a region 67 facing the back surface 40b of the backlight unit 40 in a state of the bonded double-sided tape 60. The region 67 is provided with the opening 65. In an example shown in FIG. 10, the region 67 of the double-sided tape 60 is formed so as to have a frame shape, and a through hole is formed at center of the frame. In this case, the bonding area of the double-sided tape 60 is smaller than that of the example shown in FIG. 7. In the case of the display apparatus DSP2, when recovery work (repair) is necessary after the double-sided tape 60 is pasted, an effect of easiness of the peeling off is exerted by local force application. When the double-sided tape 60 is formed so as to have the frame shape, even if the bonding area of the double-sided tape 60 is small, an area surrounded by the region bonded with the double-sided tape 60 is large. In this case, even if the bonding area is small, the bonding strength of the entire double-sided tape 60 can be improved. In other words, in the present modification example, it is easy to peel off the double-sided tape 60 if needed while it is difficult to peel off the double-sided tape 60 if the double-sided tape is not intendedly peeled off. When the resin bonding material is used in place of the double-sided tape 60, it is difficult to peel off the flexible wiring board 50 from the cured resin bonding material, and therefore, the usage of the double-sided tape 60 is more advantageous than the usage of the resin bonding material even in view of easiness of the repair.

As a modification example of FIG. 10, the double-sided tape 60 is pasted on only the region 66 while the double-sided tape 60 is not pasted on the region 67 in some cases although illustration is omitted. As another modification example, the semiconductor chip CP1 shown in FIG. 4 is mounted on the flexible wiring board 50 in some cases. When the semiconductor chip CP1 is mounted on the flexible wiring board 50, a support strength of the mounted semiconductor chip CP1 is improved by increasing the thickness of the flexible wiring board 50. The larger the thickness of the flexible wiring board 50 is, the larger the elasticity of the insulating film 52 is. Therefore, it is easy to peel off the flexible wiring board 50 from the backlight unit 40. Therefore, it is preferable to increase each of the bonding area between the double-sided tape 60 and the flexible wiring board 50 and the bonding area between the double-sided tape 60 and the backlight unit 40.

In the scope of the concept of the present invention, various modification examples and alteration examples could have been easily anticipated by those who are skilled in the art, and it would be understood that these various modification examples and alteration examples belong to the scope of the present invention. For example, the ones obtained by appropriate addition, removal, or design-change of the components to/from/into each of the above-described embodiments by those who are skilled in the art or obtained by addition, omitting, or condition-change of the step to/from/into each of the above-described embodiments are also within the scope of the present invention as long as the ones include the concept of the present invention.

The present invention can be utilized for a display apparatus.

What is claimed is:

1. A display apparatus comprising: a first substrate having a first front surface having a first terminal formed thereon, a first back surface positioned on an opposite side of the first front surface and a first side surface crossing the first front surface and the first back surface; a light supply portion having a second front surface facing the first back surface, a second back surface positioned on an opposite side of the second front surface and a second side surface crossing the second front surface and the second back surface; a flexible wiring board having a wiring electrically connected to the first terminal and having an insulating film with flexibility covering the wiring; and a double-sided tape having a base film and a sticking layer formed on each of both surfaces of the base film, wherein the flexible wiring board is bonded to the second side surface of the light supply portion through the double-sided tape, wherein, in a thickness direction of the light supply portion, the first side surface of the first substrate and the second side surface of the light supply portion do not overlap each other, and a part of the second front surface of the light supply portion, the part including the second side surface, does not overlap the first substrate.

2. The display apparatus according to claim 1,
wherein the flexible wiring board is boned to the second side surface and the second back surface of the light supply portion through the double-sided tape.

3. The display apparatus according to claim 2,
wherein a bonding area between the double-sided tape and the second back surface is larger than a bonding area between the double-sided tape and the second side surface.

4. The display apparatus according to claim 2,
wherein the double-sided tape includes:
a first region facing the second side surface of the light supply portion;
a second region facing the second back surface of the light supply portion; and
an opening formed in the second region.

5. The display apparatus according to claim 2,
wherein the flexible wiring board is boned to the second side surface and the second back surface of the light supply portion through the double-sided tape.

6. The display apparatus according to claim 5,
wherein a bonding area between the double-sided tape and the second back surface is larger than a bonding area between the double-sided tape and the second side surface.

7. The display apparatus according to claim 5,
wherein the double-sided tape includes:
a first region facing the second side surface of the light supply portion;
a second region facing the second back surface of the light supply portion; and
an opening formed in the second region.

* * * * *